(12) United States Patent
Chen et al.

(10) Patent No.: US 11,721,656 B2
(45) Date of Patent: Aug. 8, 2023

(54) INTEGRATED DEVICE COMPRISING PILLAR INTERCONNECT WITH CAVITY

(71) Applicant: QUALCOMM Incorporated, San Diego, CA (US)

(72) Inventors: Yujen Chen, Taichung (TW); Hung-Yuan Hsu, Taichung (TW); Dongming He, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 60 days.

(21) Appl. No.: 17/409,334

(22) Filed: Aug. 23, 2021

(65) Prior Publication Data
US 2023/0057439 A1 Feb. 23, 2023

(51) Int. Cl.
*H01L 23/00* (2006.01)

(52) U.S. Cl.
CPC .............. *H01L 24/13* (2013.01); *H01L 24/11* (2013.01); *H01L 24/03* (2013.01); *H01L 24/04* (2013.01); *H01L 24/05* (2013.01); *H01L 24/16* (2013.01); *H01L 2224/03912* (2013.01); *H01L 2224/0401* (2013.01); *H01L 2224/05562* (2013.01); *H01L 2224/1146* (2013.01); *H01L 2224/1182* (2013.01); *H01L 2224/11849* (2013.01); *H01L 2224/13019* (2013.01); *H01L 2224/1357* (2013.01); *H01L 2224/13147* (2013.01); *H01L 2224/13564* (2013.01); *H01L 2224/16225* (2013.01); *H01L 2224/16503* (2013.01)

(58) Field of Classification Search
CPC ...................................................... H01L 24/13
See application file for complete search history.

(56) References Cited

U.S. PATENT DOCUMENTS

| | | |
|---|---|---|
| 2012/0273938 A1 | 11/2012 | Choi et al. |
| 2012/0326296 A1 | 12/2012 | Choi et al. |
| 2014/0027900 A1 | 1/2014 | Chiu et al. |
| 2014/0061906 A1 | 3/2014 | Liao |
| 2014/0159235 A1 | 6/2014 | Odaira |
| 2016/0372430 A1* | 12/2016 | Arvin ...................... H01L 24/13 |
| 2017/0250153 A1 | 8/2017 | Kikuchi et al. |
| 2019/0189577 A1 | 6/2019 | Chen et al. |
| 2020/0365543 A1 | 11/2020 | Shah et al. |

OTHER PUBLICATIONS

International Search Report and Written Opinion—PCT/US2022/035751—ISA/EPO—dated Oct. 12, 2022.

* cited by examiner

*Primary Examiner* — William A Harriston
(74) *Attorney, Agent, or Firm* — Loza & Loza, LLP

(57) ABSTRACT

A package comprising a substrate and an integrated device coupled to the substrate through a plurality of pillar interconnects and a plurality of solder interconnects. The plurality of pillar interconnects includes a first pillar interconnect comprising a first cavity. The plurality of solder interconnects comprises a first solder interconnect located in the first cavity of the first pillar interconnect. A planar cross section that extends through the first cavity of the first pillar interconnect may comprise an O shape. The first pillar interconnect comprises a first pillar interconnect portion comprising a first width; and a second pillar interconnect portion comprising a second width that is different than the first width.

25 Claims, 12 Drawing Sheets

CROSS SECTIONAL PROFILE VIEW

CROSS SECTIONAL PROFILE VIEW

TOP PLAN VIEW

CROSS SECTIONAL PROFILE VIEW

CROSS SECTIONAL PROFILE VIEW

INTEGRATED DEVICE COMPRISING PILLAR INTERCONNECT WITH CAVITY

FIELD

Various features relate to integrated devices.

BACKGROUND

A package may include a substrate and integrated devices. These components are coupled together to provide a package that may perform various electrical functions. The performance of a package and its components may depend on the quality of the joints between various components of the package. There is an ongoing need to provide packages that include secure and reliable joints between components.

SUMMARY

Various features relate to integrated devices.

One example provides an integrated device that includes a die portion. The die portion includes a plurality of pads and a plurality of under bump metallization interconnects coupled to the plurality of pads. The integrated device includes a plurality of pillar interconnects coupled to the plurality of under bump metallization interconnects. The plurality of pillar interconnects comprises a first pillar interconnect comprising a first cavity.

Another example provides a package that includes a substrate and an integrated device coupled to the substrate through a plurality of pillar interconnects and a plurality of solder interconnects. The plurality of pillar interconnects comprises a first pillar interconnect comprising a first cavity.

Another example provides a method for fabricating an integrated device. The method provides a die portion. The die portion includes a plurality of pads and a plurality of under bump metallization interconnects coupled to the plurality of pads. The method forms a plurality of pillar interconnects over the plurality of under bump metallization interconnects. Forming the plurality of pillar interconnects comprises forming a first pillar interconnect comprising a first cavity.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate and an integrated device coupled to the substrate through a plurality of pillar interconnects and a plurality of solder interconnects. The plurality of pillar interconnects includes a first pillar interconnect comprising a first cavity. The plurality of solder interconnects comprises a first solder interconnect located in the first cavity of the first pillar interconnect. A planar cross section that extends through the first cavity of the first pillar interconnect comprises an O shape. The first pillar interconnect includes a first pillar interconnect portion comprising a first width and a second pillar interconnect portion comprising a second width that is different than the first width. The first cavity allows more surface area for the first solder interconnect to couple to, thus providing a more robust and reliable joint between the integrated device and the substrate. The first cavity may also allow more solder interconnect to be located between the first pillar interconnect and the substrate, without causing a short between neighboring interconnects of the substrate. The more robust and reliable joint provides a more reliable electrical path for current and/or signal traveling between the integrated device and the substrate, which can lead to improved performances for the integrated device and the package.

Exemplary Integrated Device Comprising a Pillar Interconnect with Cavity

Figure 1:
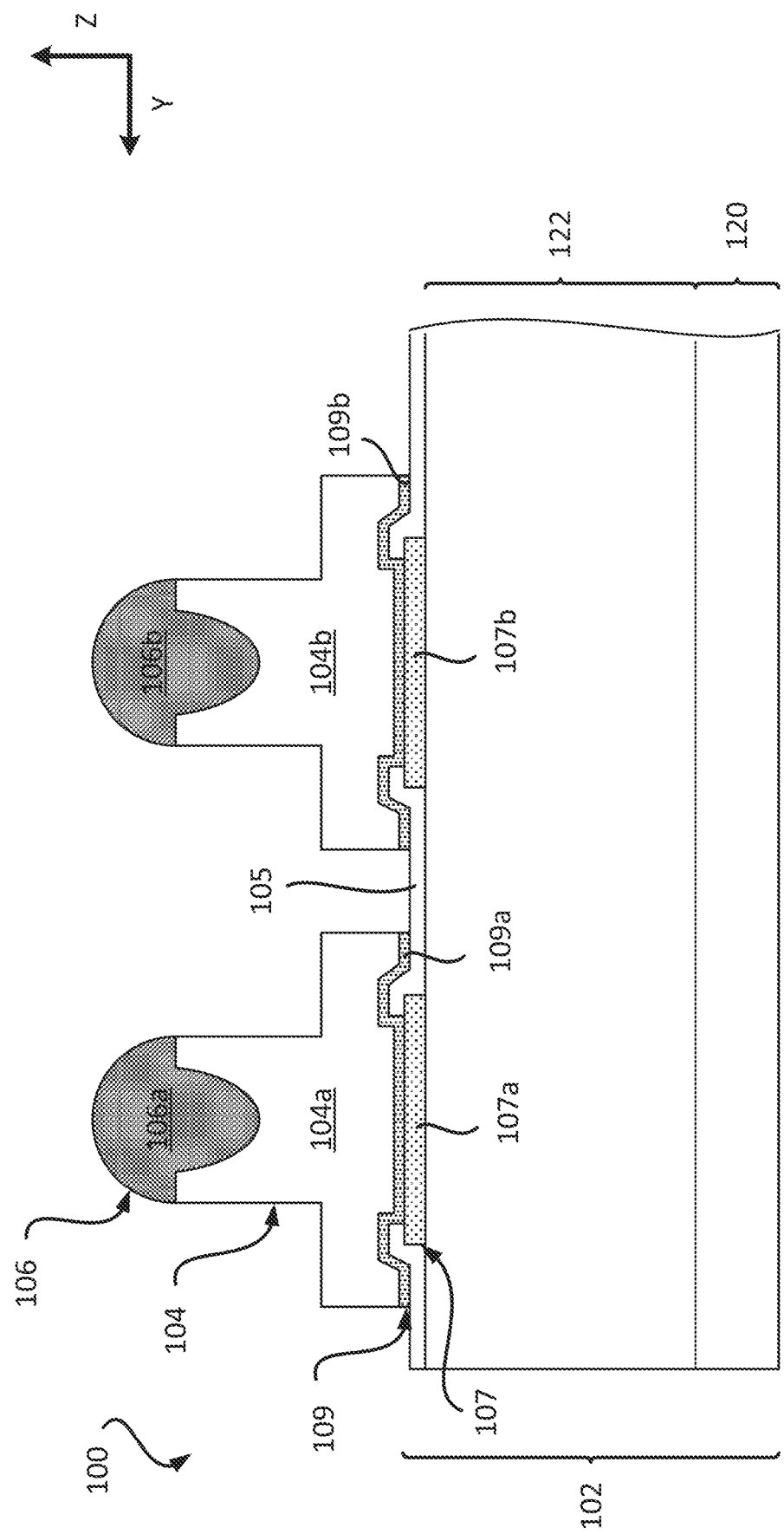
FIG. 1 illustrates a cross sectional profile view of an exemplary integrated device that includes pillar interconnects with a cavity.

FIG. 1 illustrates a cross sectional profile view of an integrated device 100 that includes pillar interconnects with a cavity. The integrated device 100 includes a die portion 102, a plurality of pillar interconnects 104 and a plurality of solder interconnects 106. The plurality of pillar interconnects 104 is coupled to the die portion 102. The plurality of solder interconnects 106 is coupled to the plurality of pillar interconnects 104. As will be further described below, at least one pillar interconnect from the plurality of pillar interconnects 104 may include a cavity that extends at least partially along a height of the pillar interconnect. The cavity creates extra surface area for solder interconnects to couple to. The cavity also creates more space to accommodate more solder interconnect, while reducing the likelihood of shorting with a nearby interconnect. The extra surface area of the pillar interconnect and/or the additional volume of solder interconnect helps provide a more robust and reliable joint for the integrated device, thus providing a more robust and reliable electrical path for current(s) to and from the integrated device. The integrated device 100 may include a flip chip.

The die portion 102 includes a die substrate 120, an interconnect portion 122, a passivation layer 105, a plurality of pads 107, and a plurality of under bump metallization interconnects 109. The die substrate 120 may include silicon (Si). A plurality of cells and/or transistors (not shown) may be formed in and/or over the die substrate 120. Different implementations may use different types of transistors, such as a field effect transistor (FET), planar FET, finFET, and a gate all around FET. In some implementations, a front end of line (FEOL) process may be used to fabricate the plurality of cells and/or transistors in and/or over the die substrate 120. The interconnect portion 122 is located over and coupled to the die substrate 120. The interconnect portion 122 may be coupled to the plurality of cells and/or transistors located in and/or over the die substrate 120. The interconnect portion 122 may include at least one dielectric layer and a plurality of die interconnects (not shown), where the plurality of die interconnects are coupled to the plurality of cells and/or transistors. In some implementations, a back end of line (BEOL) process may be used to fabricate the interconnect portion 122.

The passivation layer 105 is located over and coupled to the interconnect portion 122. The plurality of pads 107 is located over the interconnect portion 122. The plurality of pads 107 may be coupled to die interconnects of the interconnect portion 122. In some implementations, the passivation layer 105 and/or the plurality of pads 107 may be considered part of the interconnect portion 122. In some implementations, a back end of line (BEOL) process may be used to fabricate the passivation layer 105 and the plurality of pads 107. The plurality of under bump metallization interconnects 109 is coupled to the plurality of pads 107. The plurality of under bump metallization interconnects 109 may be located over the plurality of pads 107. In some implementations, there may be additional interconnects between the plurality of pads 107 and the plurality of under bump metallization interconnects 109. For example, there may be metallization interconnects between the plurality of pads 107 and the plurality of under bump metallization interconnects 109. Examples of metallization interconnects include redistribution interconnects. In some implementations, the plurality of under bump metallization interconnects 109 may be coupled to the plurality of pads 107 through metallization interconnects (e.g., redistribution interconnects). Thus, the plurality of under bump metallization interconnects 109 that is coupled to the plurality of pads 107 may be coupled directly to the plurality of pads 107 and/or indirectly coupled to the plurality of pads 107 through at least one metallization interconnect.

The plurality of pillar interconnects 104 may be coupled to the die portion 102. The plurality of pillar interconnects 104 may be coupled to the plurality of under bump metallization interconnects 109. The plurality of pillar interconnects 104 may be coupled to the die portion 102 through the plurality of under bump metallization interconnects 109. The plurality of pillar interconnects 104 may be a means for pillar interconnection. The plurality of under bump metallization interconnects 109 may be a means for under bump metallization interconnection.

The plurality of pads 107 includes a first pad 107a and a second pad 107b. The plurality of under bump metallization interconnects 109 includes a first under bump metallization interconnect 109a and a second under bump metallization interconnect 109b. The plurality of pillar interconnects 104 includes a first pillar interconnect 104a and a second pillar interconnect 104b. The plurality of solder interconnect 106 includes a first solder interconnect 106a and a second solder interconnect 106b.

The first under bump metallization interconnect 109a is coupled to the first pad 107a. The first pillar interconnect 104a is coupled to the first under bump metallization interconnect 109a. The first solder interconnect 106a is coupled to the first pillar interconnect 104a. The first pillar interconnect 104a includes a first cavity, and part of the first solder interconnect 106a may be located in the first cavity of the first pillar interconnect 104a. It is noted that in some implementations, the first pillar interconnect 104a is coupled to the first under bump metallization interconnect 109a through at least one metallization interconnect. That is, at least one metallization interconnect (e.g., redistribution interconnect) may be located between the first pillar interconnect 104a and the first under bump metallization interconnect 109a.

The second under bump metallization interconnect 109b is coupled to the second pad 107b. The second pillar interconnect 104b is coupled to the second under bump metallization interconnect 109b. The second solder interconnect 106b is coupled to the second pillar interconnect 104b. The second pillar interconnect 104b includes a second cavity, and part of the second solder interconnect 106b may be located in the second cavity of the second pillar interconnect 104b. An example of a cavity of a pillar interconnect is further described below in at least FIG. 2. It is noted that in some implementations, the second pillar interconnect 104b is coupled to the second under bump metallization interconnect 109b through at least one metallization interconnect. That is, at least one metallization interconnect (e.g., redistribution interconnect) may be located between the second pillar interconnect 104b and the second under bump metallization interconnect 109b.

Figure 2:
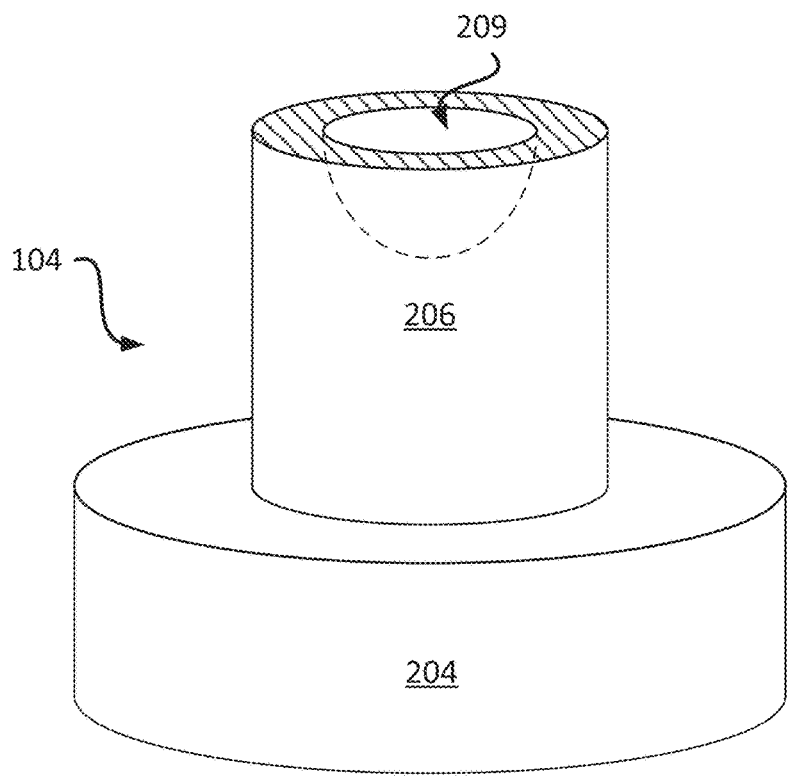
FIG. 2 illustrates an exemplary pillar interconnect with a cavity.

FIG. 2 illustrates an exemplary view of a pillar interconnect 104. The pillar interconnect 104 of FIG. 2 may represent any of the pillar interconnects from the plurality of pillar interconnects from FIG. 1. As shown in FIG. 2, the pillar interconnect 104 includes a cavity 209. The cavity 209 may extend at least partially along a height of the pillar interconnect 104. In FIG. 2, the cavity 209 has a shape of a semi-sphere (e.g., bowl). However, the shape and/or size of the cavity 209 may vary with different implementations. The cavity 209 may be a trench. The pillar interconnect 104 has the general shape of a top hat, even though the pillar interconnect 104 has the cavity 209. A brim portion of the top hat shaped pillar interconnect 104 may be coupled to the under bump metallization interconnect.

The pillar interconnect 104 includes a first pillar interconnect portion 204 and a second pillar interconnect portion 206. The first pillar interconnect portion 204 may represent a base of the pillar interconnect 104. The first pillar interconnect portion 204 may be considered a brim portion of the pillar interconnect 104. The first pillar interconnect portion 204 may be coupled to an under bump metallization interconnect (e.g., 109a, 109b). The first pillar interconnect portion 204 includes a first width. The first width may include a first diameter. The second pillar interconnect portion 206 includes a second width. The second width may include a second diameter. The second width is different than the first width. For example, the second width may be smaller than the first width. The cavity 209 is located in the second pillar interconnect portion 206. The cavity 209 may extend at least partially along the height of the pillar interconnect 104 (e.g., along height of the second pillar interconnect portion 206). FIG. 2 illustrates that the planar cross section area of the pillar interconnect 104 is circular. However, the pillar interconnect 104 may have a planar cross section with any shape (e.g., oval, rectangular, square). A solder interconnect (e.g., 106a, 106b) may be coupled to the second pillar interconnect portion 206. Part of the solder interconnect may be located in the cavity 209 of the pillar interconnect 104. It is noted that the first pillar interconnect portion 204 and the second pillar interconnect portion 206 may be considered as one portion or as two or more separate portions. There may or may not be an interface between the first pillar interconnect portion 204 and the second pillar interconnect portion 206. It is also noted that in some implementations, part of the pillar interconnect 104 may be considered part of a metallization layer (e.g., redistribution layer) of an integrated device.

Figure 3:
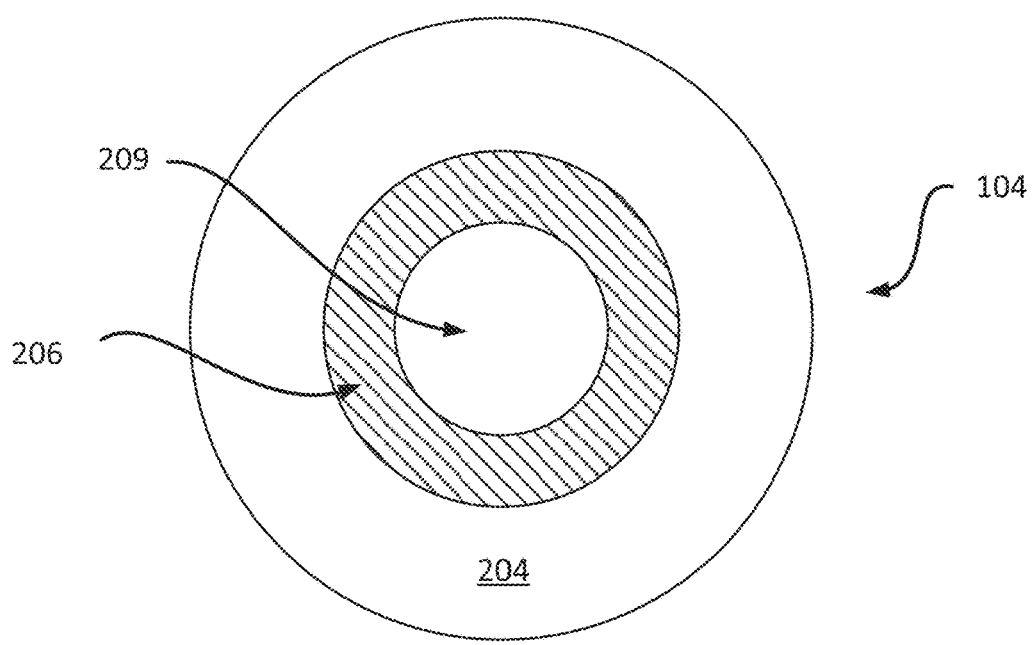
FIG. 3 illustrates a cross sectional planar view of an exemplary pillar interconnect with a cavity.

FIG. 3 illustrates a cross sectional planar view of the pillar interconnect 104. As shown in FIG. 3, a planar cross section that extends through the cavity 209 of the first pillar interconnect 104 comprises an O shape. For example, a planar cross section that extends through the cavity 209 of the second pillar interconnect portion 206 comprises an O shape. However, different implementations may have different shapes for the planar cross section of the pillar interconnect 104. The pillar interconnect 104 may have different sizes. For example, the first pillar interconnect portion 204 may have a first width (e.g., first diameter) that is in a range of about 50-70 micrometers. The second pillar interconnect portion 206 may have a second width (e.g., second diameter) that is in a range of about 30-50 micrometers. The cavity 209 may have a cavity width (e.g., cavity diameter) that is in a range of about 20-40 micrometers. The pillar interconnect 104 may have a height that is in a range of about 10-15 micrometers. It is noted that the values and ranges mentioned above are exemplary, and are not meant to be limiting. In some implementations, the values and/or ranges may include values that are greater or less than what is mentioned above.

Figure 4:
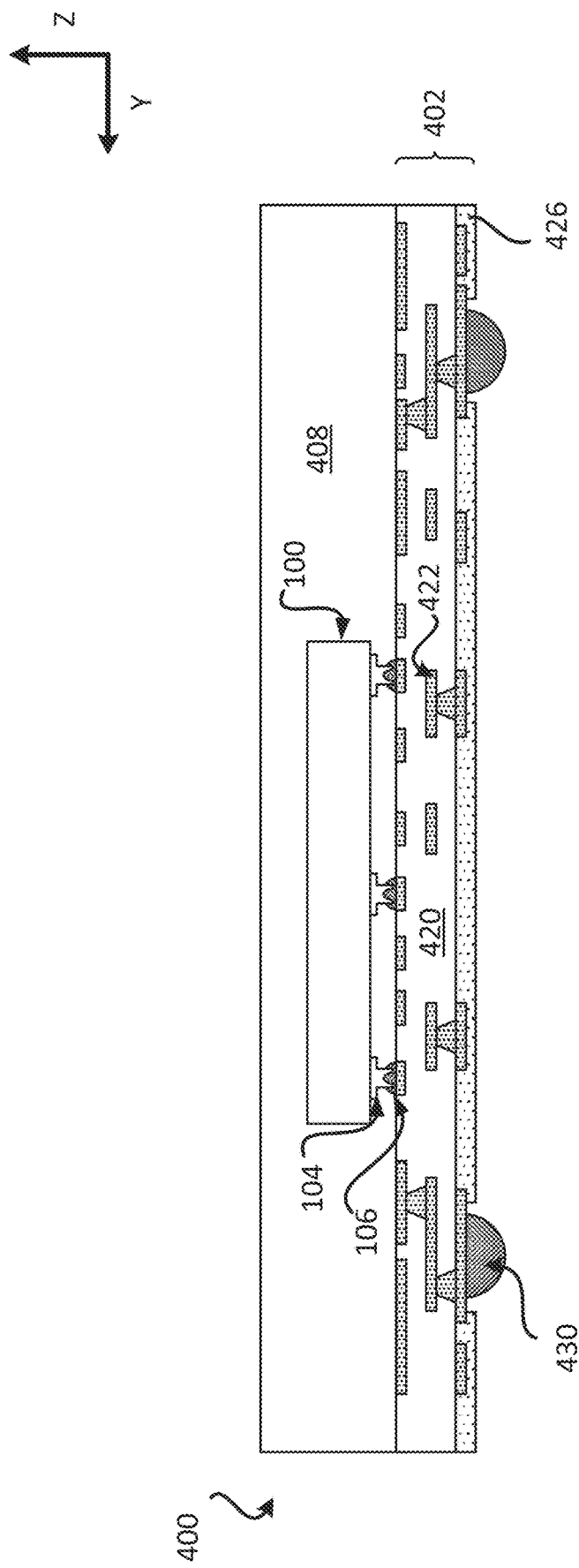
FIG. 4 illustrates a cross sectional profile view of an exemplary package comprising an integrated device that includes pillar interconnects with a cavity.

The integrated device 100 may be implemented in a package. FIG. 4 illustrates a package 400 that includes a substrate 402, the integrated device 100 and an encapsulation layer 408. The substrate 402 includes at least one dielectric layer 420, a plurality of interconnects 422, and a solder resist layer 426. A plurality of solder interconnects 430 may be coupled to the plurality of interconnects 422 of the substrate 402. The integrated device 100 is coupled to a first surface (e.g., top surface) of the substrate 402 through the plurality of pillar interconnects 104 and the plurality of solder interconnects 106. The encapsulation layer 408 may be located over and/or around the integrated device 100 and/or the substrate 402. The encapsulation layer 408 may at least partially encapsulate the integrated device 100. The encapsulation layer 408 may include a mold, a resin and/or an epoxy. The encapsulation layer 408 may be a means for encapsulation. The encapsulation layer 408 may be provided by using a compression and transfer molding process, a sheet molding process, or a liquid molding process.

Figure 5:
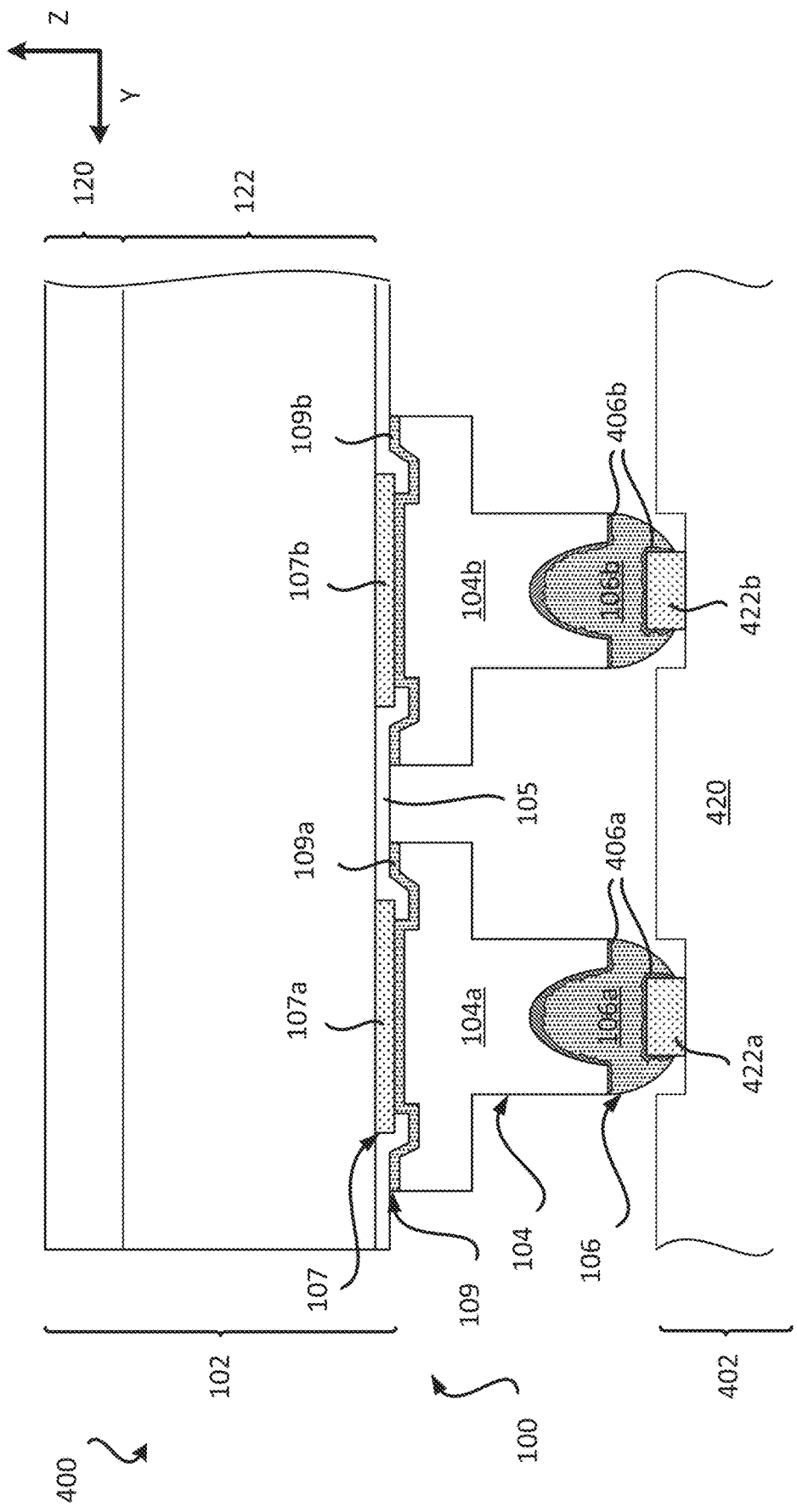
FIG. 5 illustrates a close-up view of an exemplary package comprising an integrated device that includes pillar interconnects with a cavity, where the integrated device is coupled to a substrate.

FIG. 5 illustrates a close-up view of how an integrated device may be coupled to a substrate. FIG. 5 may illustrate a portion of the package 400 that includes the integrated device 100 and the substrate 402. The integrated device 100 is coupled to the substrate 402 through the plurality of pillar interconnects 104 and the plurality of solder interconnects 106.

As shown in FIG. 5, the first pillar interconnect 104a is coupled to the first solder interconnect 106a. The first solder interconnect 106a is coupled to a first interconnect 422a of the substrate 402. The first solder interconnect 106a may include an intermetallic compound (IMC) 406a. The intermetallic compound 406a may be coupled to the first pillar interconnect 104a and the first interconnect 422a. The intermetallic compound 406a may be formed when metal from the first interconnect 422a and/or the first pillar interconnect 104a diffuses in the solder interconnect 106a.

The second pillar interconnect 104b is coupled to the second solder interconnect 106b. The second solder interconnect 106b is coupled to a second interconnect 422b of the substrate 402. The second solder interconnect 106b may include an intermetallic compound (IMC) 406b. The intermetallic compound 406b may be coupled to the second pillar interconnect 104b and the second interconnect 422b. The intermetallic compound 406b may be formed when metal from the second interconnect 422b and/or the second pillar interconnect 104b diffuses in the solder interconnect 106b.

FIG. 5 illustrates that there a bigger gap between the intermetallic compound (e.g., 406a) of the solder interconnect (e.g., 106a). This helps provides a more robust and reliable joint. This also helps reduce stress during the coupling of the integrated device and the substrate, which helps reduce the likelihood of cracks in the package. The additional space that the cavity in the pillar interconnect provides, helps avoid solder cracks, since the increase solder volume makes it less likely that the solder will separate.

An integrated device (e.g., 100) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 100) may include at least one electronic circuit (e.g., first electronic circuit, second electronic circuit, etc . . . ). An integrated device may be an example of an electrical component and/or electrical device.

Having described an integrated device with pillar interconnects with a cavity, a method for fabricating an integrated device will now be described below.

Exemplary Sequence for Fabricating an Integrated Device Comprising a Pillar Interconnect with Cavity In some implementations, fabricating an integrated device includes several processes. FIGS. 6A-6D illustrate an exemplary sequence for providing or fabricating an integrated device comprising a pillar interconnect with a cavity. In some implementations, the sequence of FIGS. 6A-6D may be used to provide or fabricate the integrated device 100. However, the process of FIGS. 6A-6D may be used to fabricate any of the integrated devices described in the disclosure.

It should be noted that the sequence of FIGS. 6A-6D may combine one or more stages in order to simplify and/or clarify the sequence for providing or fabricating an integrated device. In some implementations, the order of the processes may be changed or modified. In some implementations, one or more of processes may be replaced or substituted without departing from the scope of the disclosure.

Figure 6A:
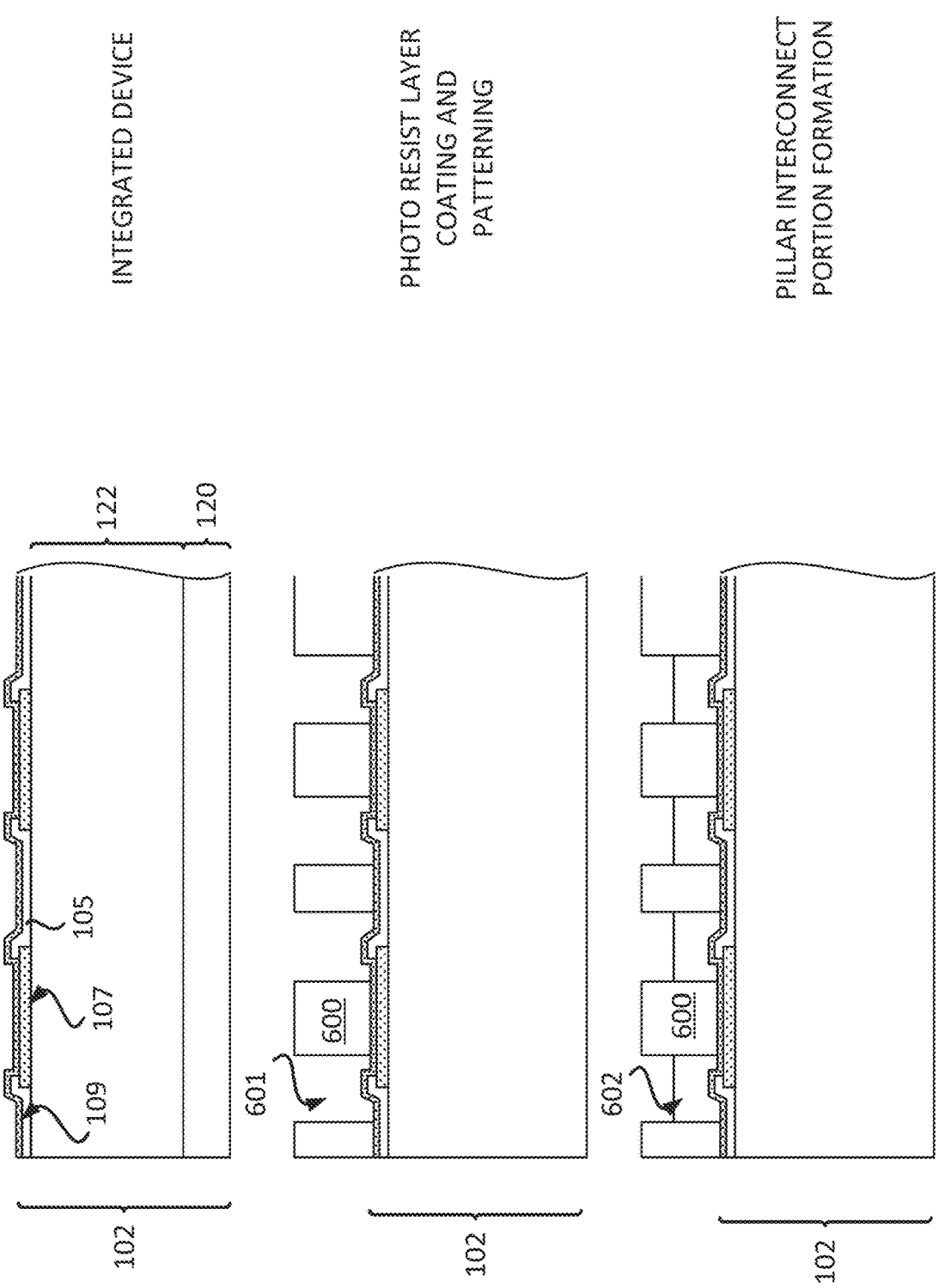
FIGS. 6A-6D illustrate an exemplary sequence for fabricating an integrated device that includes pillar interconnects with a cavity.

Stage 1, as shown in FIG. 6A, illustrates a state after a die portion 102 is provided. The die portion 102 may include a die substrate 120, an interconnect portion 122, a passivation layer 105, a plurality of pads 107 and a plurality of under bump metallization interconnects 109. The die portion 102 may include a bare die (e.g., semiconductor bare die).

Stage 2 illustrates a state after a first photo resist layer 600 is formed over the die portion 102 and patterned to include a plurality of openings 601 in the first photo resist layer 600. A photolithography process may be used to form and define the pattern of the first photo resist layer 600.

Stage 3 illustrates a state after pillar interconnect portions 602 are formed through the plurality of openings 601 of the first photo resist layer 600. The pillar interconnect portions 602 may be formed over the plurality of under bump metallization interconnects 109 (or under bump metallization layer). A plating process may be used to form the pillar interconnect portions 602. The pillar interconnect portions 602 may include copper.

Figure 6B:
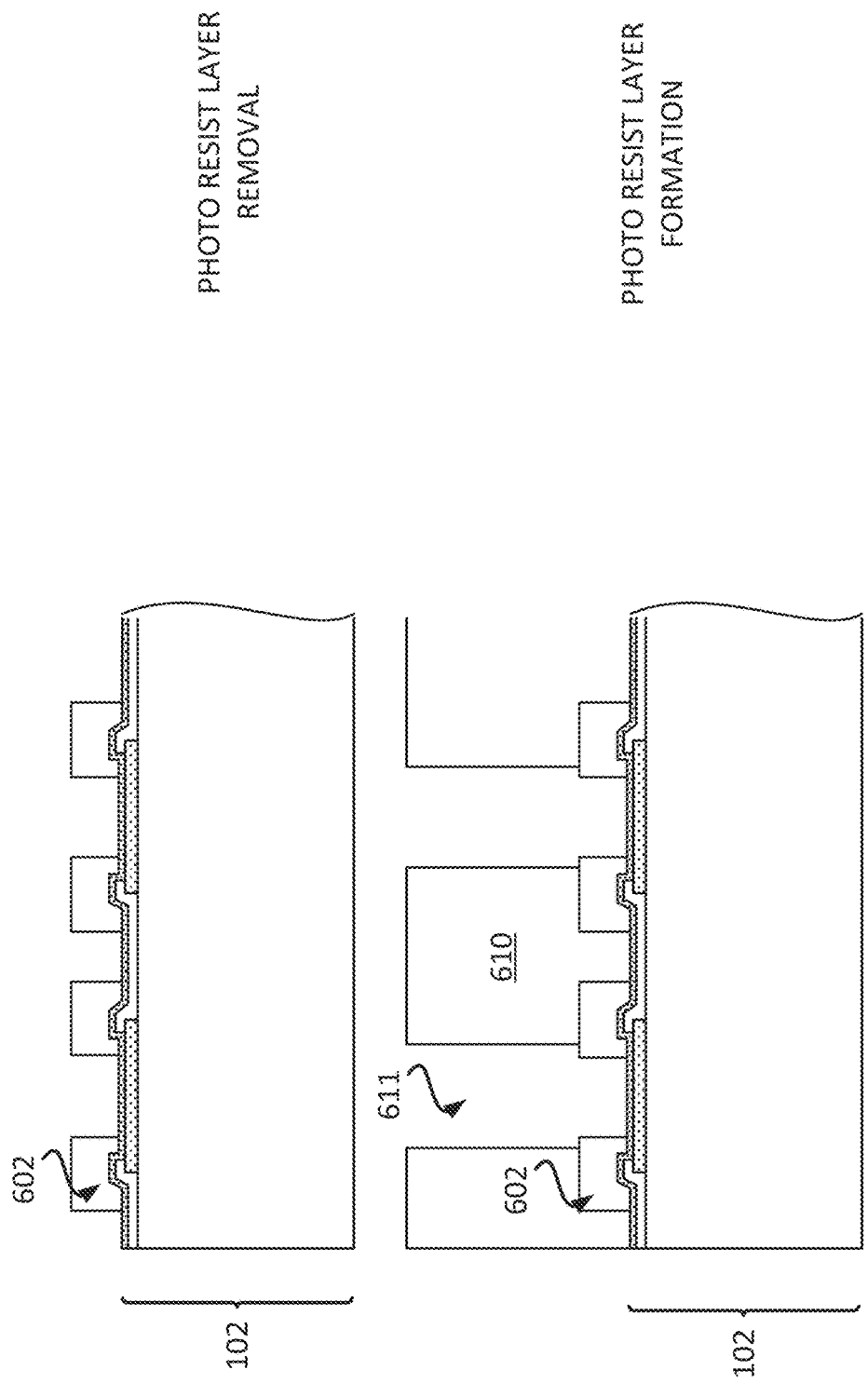

Stage 4, as shown in FIG. 6B, illustrates a state after the first photo resist layer 600 is removed from the die portion 102. The first photo resist layer 600 may be removed through a development process. The first photo resist layer 600 may be removed through a rinsing process.

Stage 5 illustrates a state after a second photo resist layer 610 is formed over the die portion 102 and patterned to include a plurality of openings 611 in the second photo resist layer 610. The second photo resist layer 610 may be formed over the pillar interconnect portions 602. A photolithography process may be used to form and define the pattern of the second photo resist layer 610.

Figure 6C:
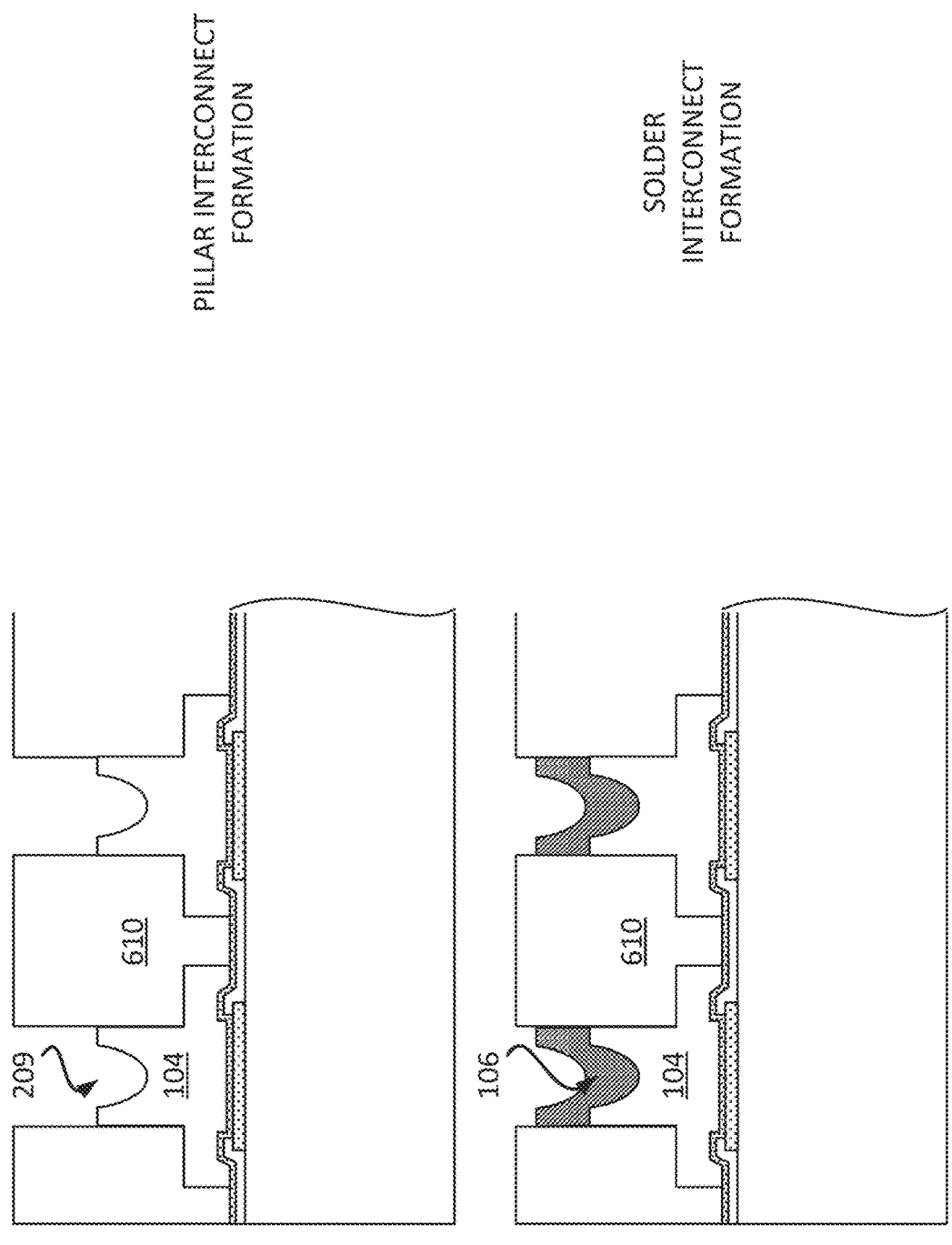

Stage 6, as shown in FIG. 6C, illustrates a state after the plurality of pillar interconnects 104 is formed through the plurality of openings 611 of the second photo resist layer 610. The plurality of pillar interconnect 104 may be formed over the plurality of under bump metallization interconnects 109 (or under bump metallization layer). The plurality of pillar interconnects 104 may be formed over the pillar interconnect portions 602. The pillar interconnect portions 602 may be considered part of the plurality of pillar interconnects 104. A plating process may be used to form the plurality of pillar interconnects 104. The pillar interconnects 104 may include copper. There may or may not be one or more interfaces between the pillar interconnect portions 602 formed at stage 3 and portions of the plurality of pillar interconnects 104 that are formed at stage 6. The plurality of pillar interconnects 104 is formed such that at least one pillar interconnect includes a cavity 209.

Stage 7 illustrates a state after a plurality of solder interconnects 106 is formed over the plurality of pillar interconnects 104 through the plurality of openings 611 of the second photo resist layer 610. In some implementations, a paste process may be used to formed the plurality of solder interconnects 106. However, the plurality of solder interconnects 106 may be formed differently.

Figure 6D:
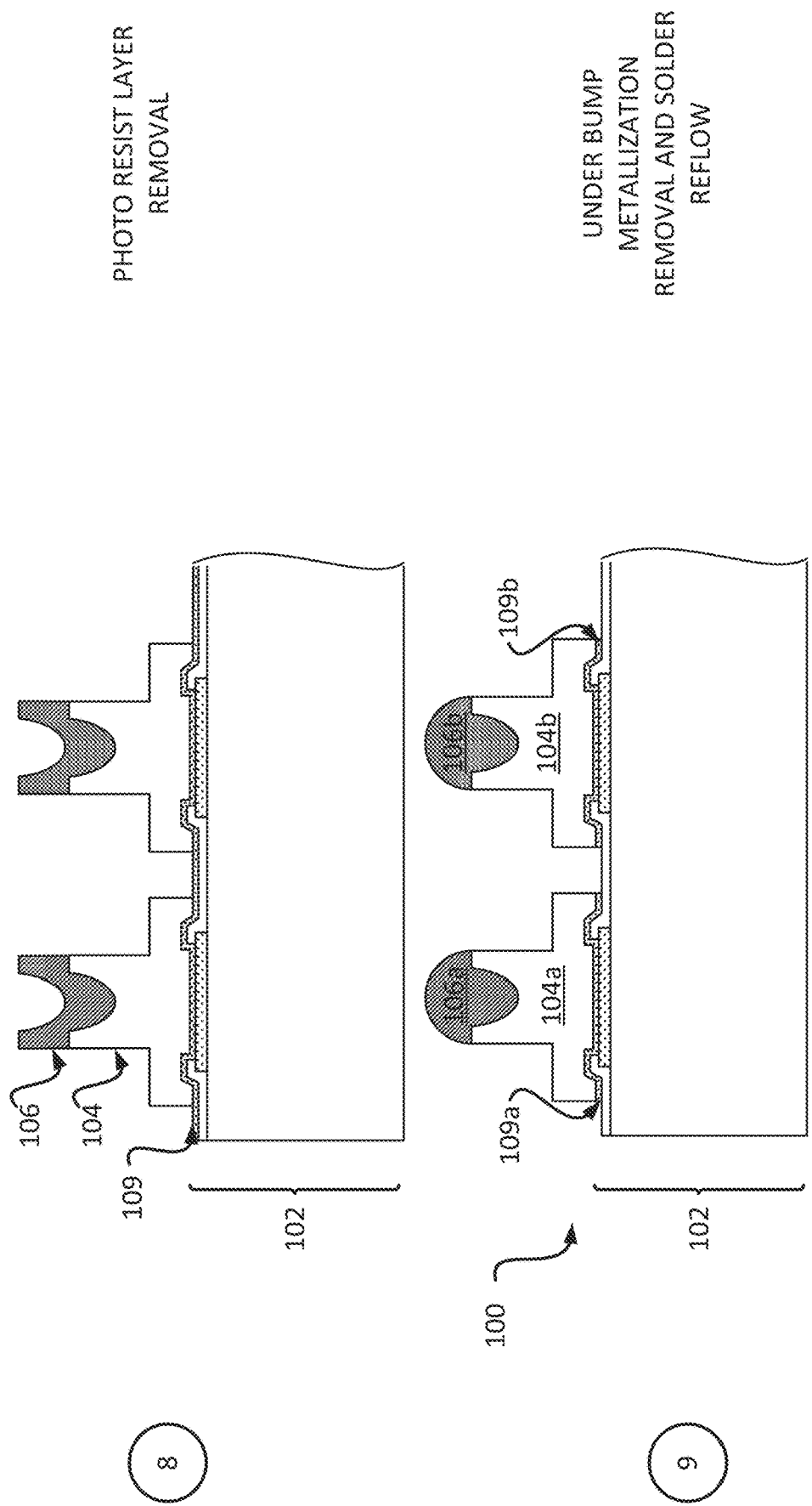

Stage 8, as shown in FIG. 6D, illustrates a state after the second photo resist layer 610 is removed from the die portion 102. The second photo resist layer 610 may be removed through a development process. The second photo resist layer 610 may be removed through a rinsing process.

Stage 9 illustrates a state after portions of an under bump metallization layer are selectively etched to define an under bump metallization interconnect 109a and an under bump metallization interconnect 109b. Stage 9 may also illustrate a state after the plurality of solder interconnects 106 has undergone a solder reflow process to couple the plurality of pillar interconnects 104. Stage 9 may illustrate an integrated device 100 that includes a die portion 102, a plurality of pillar interconnects 104, and a plurality of solder interconnects 106, where at least one pillar interconnect from the plurality of pillar interconnects 104 includes a cavity (e.g., 209) that extends at least partially through a height (e.g., thickness) of the pillar interconnect. The plurality of solder interconnects 106 may be located in the cavity of the pillar interconnect. The plurality of solder interconnects 106 includes a first solder interconnect 106a coupled to a first pillar interconnect 104a, and a second solder interconnect 106b coupled to a second pillar interconnect 104b.

Figure 7:
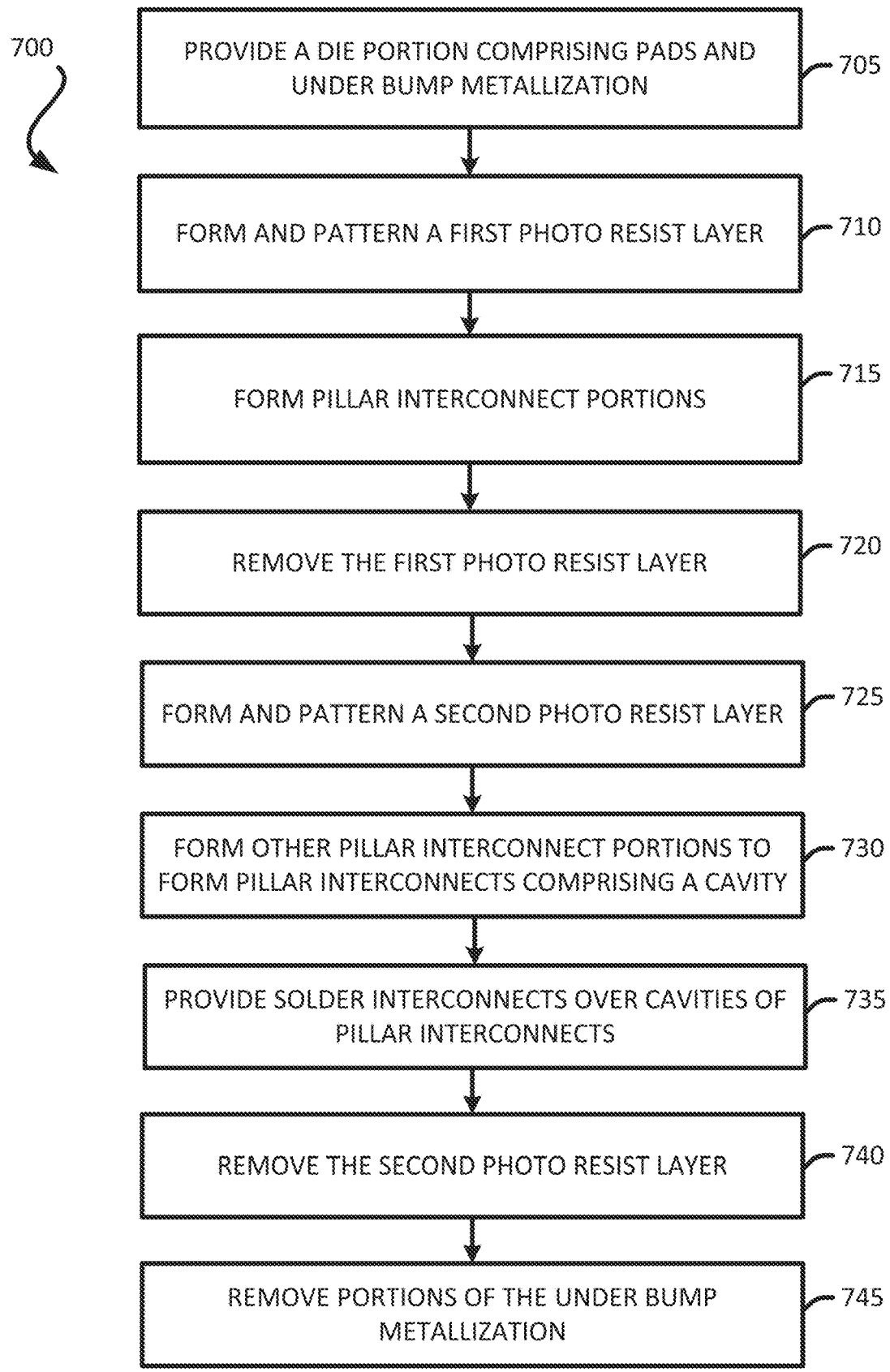
FIG. 7 illustrates an exemplary flow diagram of a method for fabricating an integrated device that includes pillar interconnects with a cavity.

Exemplary Flow Diagram of a Method for Fabricating an Integrated Device Comprising a Pillar Interconnect with Cavity In some implementations, fabricating an integrated device includes several processes. FIG. 7 illustrates an exemplary flow diagram of a method 700 for providing or fabricating an integrated device comprising pillar interconnects with a cavity. In some implementations, the method 700 of FIG. 7 may be used to provide or fabricate the integrated device 100 of FIG. 1 described in the disclosure. However, the method 700 may be used to provide or fabricate any of the integrated devices described in the disclosure.

It should be noted that the method of FIG. 7 may combine one or more processes in order to simplify and/or clarify the method for providing or fabricating an integrated device. In some implementations, the order of the processes may be changed or modified.

The method provides (at 705) a die portion (e.g., 102). The die portion 102 may include a die substrate 120, an interconnect portion 122, a passivation layer 105, a plurality of pads 107 and a plurality of under bump metallization interconnects 109. The die portion 102 may include a bare die (e.g., semiconductor bare die). Stage 1 of FIG. 6A, illustrates and describes an example of providing a die portion.

The method forms (at 710) a first photo resist layer (e.g., 600) over the die portion (e.g., 102). The method may also pattern (at 710) the first photo resist layer (e.g., 600). A photolithography process may be used to form and define the pattern of the first photo resist layer 600. Stage 2 of FIG. 6A illustrates and describes an example of forming and patterning a first photo resist layer.

The method forms (at 715) pillar interconnects portions (e.g., 602). The pillar interconnect portions 602 may be formed over the plurality of under bump metallization interconnects 109 (or under bump metallization layer). A plating process may be used to form the pillar interconnect portions 602. The pillar interconnect portions 602 may be formed through a plurality of openings 601 of the first photo resist layer 600. Stage 3 of FIG. 6A illustrates and describes an example of forming pillar interconnect portions.

The method removes (at 720) the first photo resist layer (e.g., 600). The first photo resist layer 600 may be removed through a development process. The first photo resist layer 600 may be removed through a rinsing process. Stage 4 of FIG. 6B illustrates and describes an example of removing the first photo resist layer.

The method forms (at 725) a second photo resist layer (e.g., 610) over the die portion (e.g., 102). The method may also pattern (at 725) the second photo resist layer (e.g., 610). A photolithography process may be used to form and define the pattern of the second photo resist layer 610. Stage 5 of FIG. 6B illustrates and describes an example of forming and patterning a second photo resist layer.

The method forms (at 730) another pillar interconnects portions to form a plurality of pillar interconnects 104, where at least one pillar interconnect includes a cavity (e.g., 209). The plurality of pillar interconnect 104 may be formed over the plurality of under bump metallization interconnects 109 (or under bump metallization layer). The plurality of pillar interconnects 104 may be formed over the pillar interconnect portions 602. The pillar interconnect portions 602 may be considered part of the plurality of pillar interconnects 104. A plating process may be used to form the plurality of pillar interconnects 104. There may or may not be one or more interfaces between the pillar interconnect portions 602 formed (at 715) and portions of the plurality of pillar interconnects 104 that are formed (at 730). The plurality of pillar interconnects 104 is formed such that at least one pillar interconnect includes a cavity 209. Stage 6 of FIG. 6C illustrates and describes an example of forming pillar interconnect portions to form pillar interconnects.

The method provides (at 735) a plurality of solder interconnects (e.g., 106) over the cavities (e.g., 209) of the plurality of pillar interconnects (e.g., 104). The plurality of solder interconnects 106 may be formed over the plurality of pillar interconnects 104 through the plurality of openings 611 of the second photo resist layer 610. In some implementations, a paste process may be used to formed the plurality of solder interconnects 106. However, the plurality of solder interconnects 106 may be formed differently. Stage 7 of FIG. 6C illustrates and describes an example of providing and/or forming a plurality of solder interconnects.

The method removes (at 740) the second photo resist layer (e.g., 610). The second photo resist layer 610 may be removed through a development process. The second photo resist layer 610 may be removed through a rinsing process. Stage 8 of FIG. 6D illustrates and describes an example of removing the second photo resist layer.

The method removes (at 745) portions of an under bump metallization layer. The method may selectively etch portions of the under bump metallization layer to define an under bump metallization interconnect 109a and an under bump metallization interconnect 109b. The method may perform (at 745) a solder reflow process to couple the plurality of solder interconnects 106 to the plurality of pillar interconnects 104. The plurality of solder interconnects 106 may be located in the cavities (e.g., 209) of the plurality of pillar interconnects 104. Stage 9 of FIG. 6D illustrates and describes an example of removing portions of an under bump metallization layer and a solder reflow process of the plurality of solder interconnects.

The integrated devices (e.g., 100) described in the disclosure may be fabricated one at a time or may be fabricated together as part of one or more wafers and then singulated into individual integrated devices.

Figure 8:
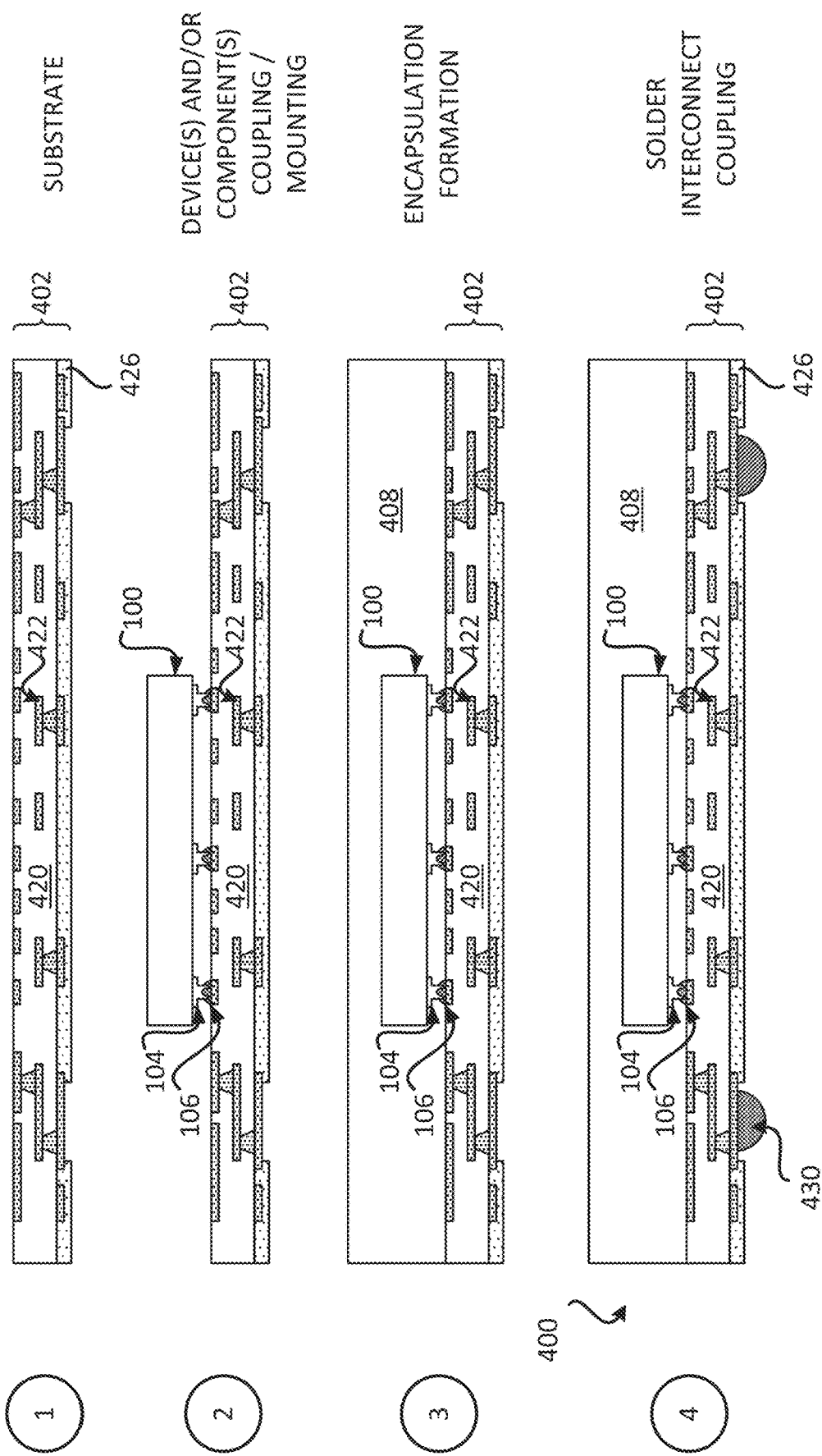
FIG. 8 illustrate an exemplary sequence for fabricating a package comprising an integrated device that includes pillar interconnects with a cavity.

Exemplary Sequence for Fabricating a Package Comprising an Integrated Device Comprising a Pillar Interconnect with Cavity In some implementations, fabricating a package includes several processes. FIG. 8 illustrates an exemplary sequence for providing or fabricating a package that includes an integrated device comprising pillar interconnects with a cavity. In some implementations, the sequence of FIG. 8 may be used to provide or fabricate the package 400 of FIG. 4. However, the process of FIG. 8 may be used to fabricate any of the packages described in the disclosure.

It should be noted that the sequence of FIG. 8 may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 8 illustrates a state after a substrate 402 is provided. The substrate 402 includes at least one dielectric layer 420, a plurality of interconnects 422 and a solder resist layer 426. Different implementations may use different substrates with different numbers of metal layers. A substrate may include a coreless substrate, a cored substrate, or an embedded trace substrate (ETS).

Stage 2 illustrates a state after the integrated device 100 is coupled to the substrate 402 through the plurality of pillar interconnects 104 and the plurality of solder interconnects 106. The integrated device 100 may be coupled to the plurality of interconnects 422 of the substrate 402 through the plurality of pillar interconnects 104 and the plurality of solder interconnects 106. A solder reflow process may be used to couple the integrated device 100 to the substrate 402. FIG. 5 illustrates an example of how the integrated device 100 may be coupled to the substrate 402. Different implementations may couple different components and/or devices to the substrate 402.

Stage 3 illustrates a state after an encapsulation layer 408 is provided (e.g., formed) over the substrate 402. The encapsulation layer 408 may encapsulate the integrated device 100. The encapsulation layer 408 may include a mold, a resin and/or an epoxy. A compression molding process, a transfer molding process, or a liquid molding process may be used to form the encapsulation layer 408. The encapsulation layer 408 may be photo etchable. The encapsulation layer 408 may be a means for encapsulation.

Stage 4 illustrates a state after a plurality of solder interconnects 430 is coupled to the substrate 402. A solder reflow process may be used to couple the plurality of solder interconnects 430 to the substrate 402.

Figure 9:
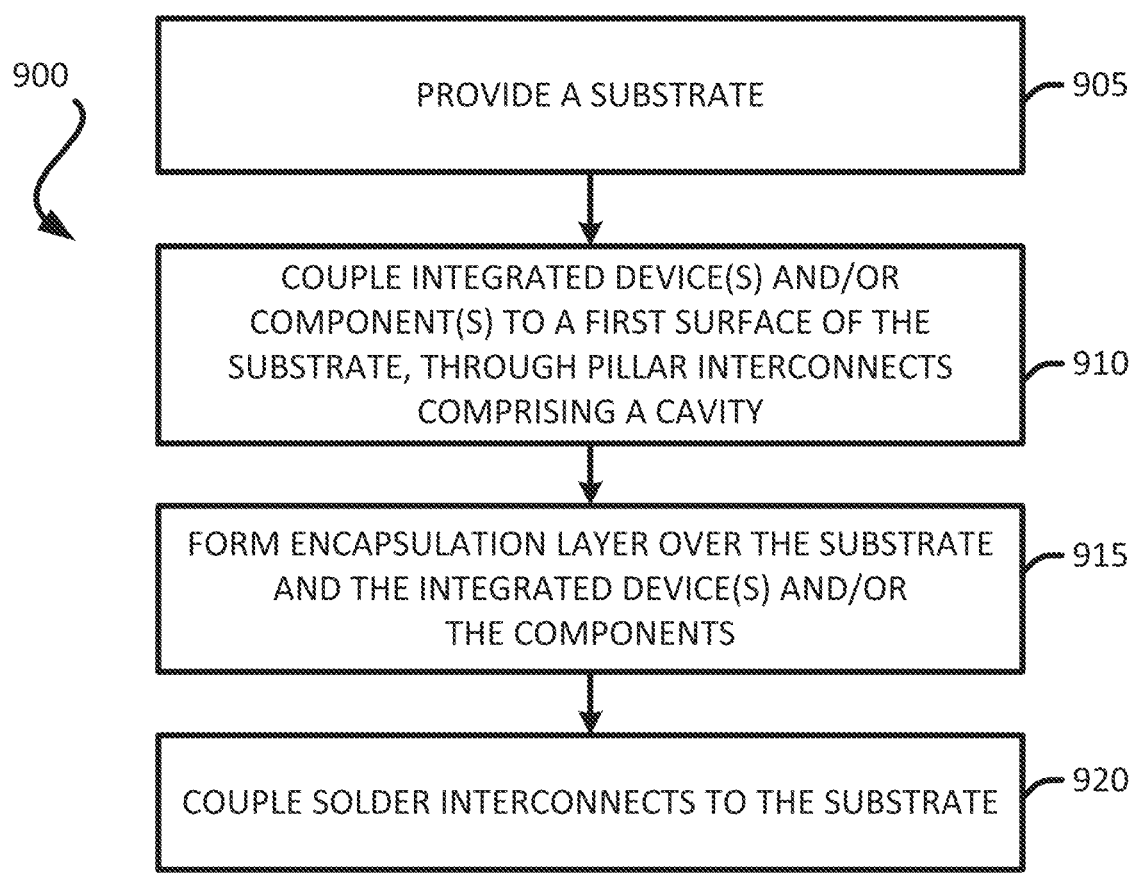
FIG. 9 illustrates an exemplary flow diagram of a method for fabricating a package comprising an integrated device that includes pillar interconnects with a cavity.

Exemplary Flow Diagram of a Method for Fabricating a Package Comprising an Integrated Device Comprising a Pillar Interconnect with Cavity In some implementations, fabricating a package includes several processes. FIG. 9 illustrates an exemplary flow diagram of a method 900 for providing or fabricating a package comprising an integrated device that includes pillar interconnects with a cavity. In some implementations, the method 900 of FIG. 9 may be used to provide or fabricate the package 400 of FIG. 4 described in the disclosure. However, the method 900 may be used to provide or fabricate any of the packages (e.g., 400) described in the disclosure.

It should be noted that the method of FIG. 9 may combine one or more processes in order to simplify and/or clarify the method for providing or fabricating a package. In some implementations, the order of the processes may be changed or modified.

The method provides (at 905) a substrate (e.g., 402). The substrate 402 may be provided by a supplier or fabricated. Different implementations may use different processes to fabricate the substrate 402. Examples of processes that may be used to fabricate the substrate 402 include a semi-additive process (SAP) and a modified semi-additive process (mSAP). The substrate 402 includes at least one dielectric layer 420, a plurality of interconnects 422, and a solder resist layer 426. The substrate 402 may include an embedded trace substrate (ETS). In some implementations, the substrate may be a core substrate. In some implementations, the at least one dielectric layer 420 may include prepreg layers and/or polyimide. Stage 1 of FIG. 8 illustrates and describes an example of providing a substrate.

The method couples (at 910) an integrated device (e.g., 100) a first surface of the substrate 402. For example, the integrated device 100 may be coupled to a first surface (e.g., top surface) of the substrate 402. The integrated device 100 is coupled to the substrate 402 through the plurality of pillar interconnects 104 and the plurality of solder interconnects 106. At least one pillar interconnect includes a cavity. Part of the solder interconnect may be located in the cavity of the pillar interconnect. A solder reflow process may be used to couple the integrated device 100 to the substrate 402. FIG. 5 illustrates an example of how the integrated device 100 may be coupled to the substrate 402. Stage 2 of FIG. 8 illustrates and describes an example of coupling an integrated device to a substrate.

The method forms (at 915) an encapsulation layer (e.g., 408) over the substrate (e.g., 402). The encapsulation layer 408 may be provided and formed over and/or around the substrate 402 and the integrated device 100. The encapsulation layer 408 may include a mold, a resin and/or an epoxy. A compression molding process, a transfer molding process, or a liquid molding process may be used to form the encapsulation layer 408. The encapsulation layer 408 may be photo etchable. The encapsulation layer 408 may be a means for encapsulation. Stage 3 of FIG. 8 illustrates and describes an example of forming an encapsulation layer.

The method couples (at 920) a plurality of solder interconnects (e.g., 430) to the substrate 402. A solder reflow process may be used to couple the plurality of solder interconnects 430 to the substrate 402. Stage 4 of FIG. 8, illustrates and describes an example of coupling solder interconnects to a substrate.

The packages (e.g., 400) described in the disclosure may be fabricated one at a time or may be fabricated together as part of one or more wafers and then singulated into individual packages.

Exemplary Electronic Devices

Figure 10:
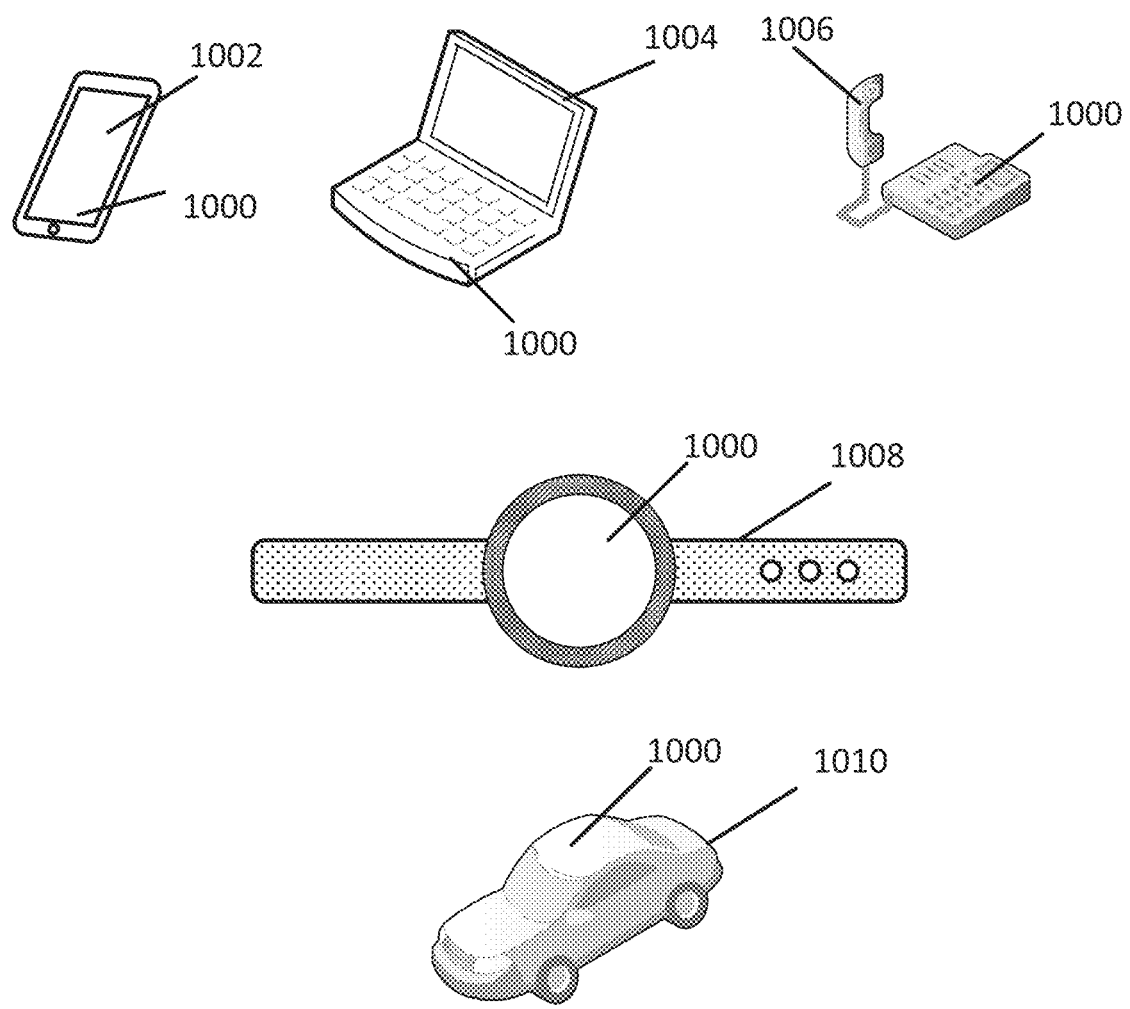
FIG. 10 illustrates various electronic devices that may integrate a die, an electronic circuit, an integrated device, an integrated passive device (IPD), a passive component, a package, and/or a device package described herein.

FIG. 10 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1002, a laptop computer device 1004, a fixed location terminal device 1006, a wearable device 1008, or automotive vehicle 1010 may include a device 1000 as described herein. The device 1000 may be, for example, any of the devices and/or integrated circuit (IC) packages described herein. The devices 1002, 1004, 1006 and 1008 and the vehicle 1010 illustrated in FIG. 10 are merely exemplary. Other electronic devices may also feature the device 1000 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any device that stores or retrieves data or computer instructions, or any combination thereof.

One or more of the components, processes, features, and/or functions illustrated in FIGS. 1-5, 6A-6D, and/or 7-10 may be rearranged and/or combined into a single component, process, feature or function or embodied in several components, processes, or functions. Additional elements, components, processes, and/or functions may also be added without departing from the disclosure. It should also be noted FIGS. 1-5, 6A-6D, and/or 7-10 and its corresponding description in the present disclosure is not limited to dies and/or ICs. In some implementations, FIGS. 1-5, 6A-6D, and/or 7-10 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace (e.g., trace interconnect), a via (e.g., via interconnect), a pad (e.g., pad interconnect), a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: An integrated device comprising a die portion. The die portion includes a plurality of pads and a plurality of under bump metallization interconnects coupled to the plurality of pads. The integrated device includes a plurality of pillar interconnects coupled to the plurality of under bump metallization interconnects. The plurality of pillar interconnects comprises a first pillar interconnect comprising a first cavity.

Aspect 2: The integrated device of aspect 1, further comprising a plurality of solder interconnects coupled to the plurality of pillar interconnects.

Aspect 3: The integrated device of aspect 2, wherein the plurality of solder interconnects comprises a first solder interconnect located in the first cavity of the first pillar interconnect.

Aspect 4: The integrated device of aspects 1 through 3, wherein a planar cross section that extends through the first cavity of the first pillar interconnect comprises an O shape.

Aspect 5: The integrated device of aspects 1 through 4, wherein the first pillar interconnect comprises: a first pillar interconnect portion comprising a first width; and a second pillar interconnect portion comprising a second width that is different than the first width.

Aspect 6: The integrated device of aspect 5, wherein the first cavity of the first pillar interconnect is located in the second pillar interconnect portion.

Aspect 7: The integrated device of aspects 1 through 6, wherein the first cavity extends partially through a height of the first pillar interconnect.

Aspect 8: The integrated device of aspects 1 through 7, wherein the first pillar interconnect comprises a shape of a top hat.

Aspect 9: The integrated device of aspects 1 through 8, wherein the integrated device comprises a flip chip.

Aspect 10: The integrated device of aspects 1 through 9, wherein the die portion comprises a die substrate; and a plurality of transistors formed in and/or over the die substrate.

Aspect 11: A package comprising a substrate and an integrated device coupled to the substrate through a plurality of pillar interconnects and a plurality of solder interconnects. The plurality of pillar interconnects comprises a first pillar interconnect comprising a first cavity.

Aspect 12: The package of aspect 11, wherein the plurality of solder interconnects comprises a first solder interconnect located in the first cavity of the first pillar interconnect.

Aspect 13: The package of aspect 12, wherein the first solder interconnect comprises an intermetallic compound (IMC).

Aspect 14: The package of aspects 11 through 13, wherein a planar cross section that extends through the first cavity of the first pillar interconnect comprises an O shape.

Aspect 15: The package of aspects 11 through 14, wherein the first pillar interconnect comprises: a first pillar interconnect portion comprising a first width; and a second pillar interconnect portion comprising a second width that is different than the first width.

Aspect 16: The package of aspect 15, wherein the first cavity of the first pillar interconnect is located in the second pillar interconnect portion.

Aspect 17: The package of aspects 11 through 16, wherein the plurality of pillar interconnects is part of the integrated device.

Aspect 18: The package of aspects 11 through 17, wherein the first pillar interconnect comprises a shape of a top hat.

Aspect 19: The package of aspects 11 through 18, wherein the package is part of a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 20: A method for fabricating an integrated device. The method provides a die portion comprising a plurality of pads and a plurality of under bump metallization interconnects coupled to the plurality of pads. The method forms a plurality of pillar interconnects over the plurality of under bump metallization interconnects. Forming the plurality of pillar interconnects comprises forming a first pillar interconnect comprising a first cavity.

Aspect 21: The method of aspect 20, wherein forming the plurality of pillar interconnects comprises forming and patterning a first photo resist layer over the die portion; forming a first pillar interconnect portion; removing the first photo resist layer; forming and patterning a second photo resist layer over the die portion; and forming a second pillar interconnect portion over the first pillar interconnect portion such that the first cavity is formed in the second pillar interconnect portion.

Aspect 22: The method of aspect 21, wherein forming the plurality of pillar interconnects further comprises forming a first solder interconnect over the first cavity of the first pillar interconnect.

Aspect 23: The method of aspect 22, wherein the first solder interconnect is located at least partially in the first cavity of the first pillar interconnect.

Aspect 24: The method of aspects 20 through 23, wherein the first cavity extends partially through a height of the first pillar interconnect.

Aspect 25: The method of aspects 20 through 24, wherein a planar cross section that extends through the first cavity of the first pillar interconnect comprises an O shape.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. An integrated device comprising:
   a die portion comprising:
      a plurality of pads; and
      a plurality of under bump metallization interconnects coupled to the plurality of pads; and
   a plurality of pillar interconnects coupled to the plurality of under bump metallization interconnects, wherein the plurality of pillar interconnects comprises a first pillar interconnect comprising:
      a first cavity;
      a first pillar interconnect portion comprising a first width of the bottom most portion of the first pillar interconnect portion closest to the die portion; and
      a second pillar interconnect portion comprising a second width that is less than the first width, the first cavity located in the second pillar interconnect portion.

2. The integrated device of claim 1, further comprising a plurality of solder interconnects coupled to the plurality of pillar interconnects.

3. The integrated device of claim 2, wherein the plurality of solder interconnects comprises a first solder interconnect located in the first cavity of the first pillar interconnect.

4. The integrated device of claim 1, wherein a planar cross section that extends through the first cavity of the first pillar interconnect comprises an O shape.

5. The integrated device of claim 1, wherein the first pillar interconnect comprises a shape of a top hat.

6. The integrated device of claim 1, wherein the integrated device comprises a flip chip.

7. The integrated device of claim 1, wherein the die portion comprises:
   a die substrate; and
   a plurality of transistors formed in and/or over the die substrate.

8. The integrated device of claim 1, further comprising:
   wherein the first width of the first pillar interconnect portion is greater than a third width of a first pad of the plurality of pads;
   wherein the first pillar interconnect portion is directly coupled to a first under bump metallization interconnect of the plurality of under bump metallization interconnects; and
   wherein the first under bump metallization interconnect of the plurality of under bump metallization interconnects is coupled to a first pad of the plurality of pads.

9. The integrated device of claim 1, further comprising:
   wherein the first width of the first pillar interconnect portion is greater than a third width of a first pad of the plurality of pads.

10. The integrated device of claim 1, wherein the first cavity extends partially through a height of the first pillar interconnect.

11. A package comprising:
    a substrate; and
    an integrated device coupled to the substrate through a plurality of pillar interconnects and a plurality of solder interconnects, wherein the plurality of pillar interconnects comprises a first pillar interconnect comprising:
       a first cavity;
       a first pillar interconnect portion comprising a first width of the bottom most portion of the first pillar interconnect portion closest to the integrated device; and
       a second pillar interconnect portion comprising a second width that is less than the first width, the first cavity located in the second pillar interconnect portion.

12. The package of claim 11, wherein the plurality of solder interconnects comprises a first solder interconnect located in the first cavity of the first pillar interconnect.

13. The package of claim 12, wherein the first solder interconnect comprises an intermetallic compound (IMC).

14. The package of claim 11, wherein a planar cross section that extends through the first cavity of the first pillar interconnect comprises an O shape.

15. The package of claim 11, wherein the plurality of pillar interconnects is part of the integrated device.

16. The package of claim 11, wherein the first pillar interconnect comprises a shape of a top hat.

17. The package of claim 11, wherein the package is part of a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

18. The package of claim 11, further comprising:
    a plurality of pads, wherein the first width of the first pillar interconnect portion is greater than a third width of a first pad of the plurality of pads;
    a plurality of under bump metallization interconnects, wherein the first pillar interconnect portion is directly coupled to a first under bump metallization interconnect of the plurality of under bump metallization interconnects; and
    wherein the first under bump metallization interconnect of the plurality of under bump metallization interconnects is coupled to the first pad of the plurality of pads.

19. A method for fabricating an integrated device, comprising:
- providing a die portion comprising:
  - a plurality of pads; and
  - a plurality of under bump metallization interconnects coupled to the plurality of pads; and
- forming a plurality of pillar interconnects over the plurality of under bump metallization interconnects, wherein forming the plurality of pillar interconnects comprises forming a first pillar interconnect comprising;
  - a first cavity,
  - a first pillar interconnect portion comprising a first width of the bottom most portion of the first pillar interconnect portion closest to the die portion; and
  - a second pillar interconnect portion comprising a second width that is less than the first width, the first cavity located in the second pillar interconnect portion.

20. The method of claim 19, wherein forming the plurality of pillar interconnects comprises:
- forming and patterning a first photo resist layer over the die portion;
- forming the first pillar interconnect portion;
- removing the first photo resist layer;
- forming and patterning a second photo resist layer over the die portion; and
- forming the second pillar interconnect portion over the first pillar interconnect portion.

21. The method of claim 20, wherein forming the plurality of pillar interconnects further comprises forming a first solder interconnect over the first cavity of the first pillar interconnect.

22. The method of claim 21, wherein the first solder interconnect is located at least partially in the first cavity of the first pillar interconnect.

23. The method of claim 19, wherein the first cavity extends partially through a height of the first pillar interconnect.

24. The method of claim 19, wherein a planar cross section that extends through the first cavity of the first pillar interconnect comprises an O shape.

25. The method of claim 19, further comprising:
- wherein the first width of the first pillar interconnect portion is greater than a third width of a first pad of the plurality of pads;
- wherein the first pillar interconnect portion is directly coupled to a first under bump metallization interconnect of the plurality of under bump metallization interconnects; and
- wherein the first under bump metallization interconnect of the plurality of under bump metallization interconnects is coupled to a first pad of the plurality of pads.

* * * * *